Figure 1:
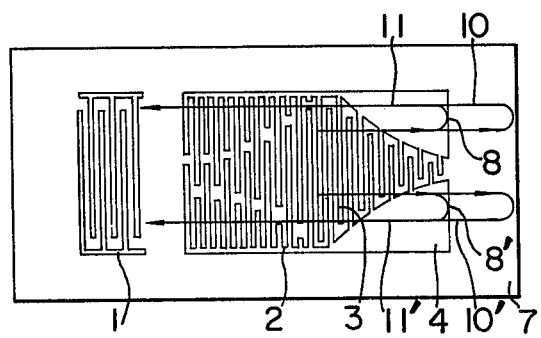

United States Patent [19]

Noro et al.

[11] 4,201,964

[45] May 6, 1980

[54] ELASTIC SURFACE WAVE DEVICE

[75] Inventors: Yoshihiko Noro, Kamakura; Katashi Hazama, Zushi; Jun Yamada, Yokohama; Hitoshi Yanagihara, Yokohama; Michiyori Miura, Yokohama, all of Japan

[73] Assignee: Hitachi, Ltd., Japan

[21] Appl. No.: 917,220

[22] Filed: Jun. 20, 1978

[30] Foreign Application Priority Data

Jun. 20, 1977 [JP] Japan ............................. 52-72056

[51] Int. Cl.² ................... H03H 9/04; H03H 9/26; H03H 9/32; H03H 9/30
[52] U.S. Cl. ................................. 333/151; 310/313; 333/154; 333/194; 333/196
[58] Field of Search ......... 333/72, 30 R, 71, 150–155, 333/193–196; 310/313, 365, 366; 331/107 A; 330/5.5

[56] References Cited

U.S. PATENT DOCUMENTS

| 3,955,159 | 5/1976 | Mitchell et al. | 333/30 R |
| 4,030,050 | 6/1977 | Deacon et al. | 333/72 |

Primary Examiner—Alfred E. Smith
Assistant Examiner—Marvin Nussbaum
Attorney, Agent, or Firm—Craig and Antonelli

[57] ABSTRACT

To eliminate disturbance signals caused by the reflection from the unitary stem areas of comb-like electrodes of an interdigital transducer in an elastic surface wave device, the edges of the unitary stem areas perpendicular to the surface wave propagating direction includes at least one pair of partial edges, the positions of the partial edges in each of the at least one pair of partial edges differ by $(2n+1)\cdot\lambda/4$ from each other in the surface wave propagating direction, and the lengths of the partial edges in the each pair are equal to each other, where n represents zero or a positive integer and λ represents the wavelength of the elastic surface.

6 Claims, 7 Drawing Figures

ELASTIC SURFACE WAVE DEVICE

This invention relates to an elastic surface wave device whose frequency characteristic is improved by suppressing the reflective waves produced in an interdigital transducer of the device.

As well known, the elastic surface wave device is an electronic device comprising a substrate of a piezoelectric material and interleaved comb-like electrodes disposed on the surface of the substrate, wherein the voltage corresponding to an input electrical signal is applied to the electrodes so that the resulting electrostriction effect generates the lattice strains in the piezoelectric material which are propagated in the surface of the material. Examples of such an elastic surface wave devices put into practice are elastic surface wave filters and elastic surface wave resonators. These devices, however, have an inherent problem that undesirable reflective waves are generated due to the property of the used piezoelectric material or due to the interaction between the piezoelectric material and the electrodes.

It is an object of the present invention to provide an elastic surface wave device in which disturbance signals caused by reflective waves from the ends of a transducer in the device is considerably suppressed.

In accordance with the present invention, there is provided an elastic surface wave device comprising a substrate of a piezoelectric material serving as a medium of the propagation of an elastic surface wave and a plurality of interdigital transducers each including a pair of interleaved comb-like electrodes provided on said substrate, wherein at least one of the interdigital transducers has overlap-weighted pair of interleaved comb-like electrodes each having a unitary stem area at its outer end, those edges of the unitary stem areas of the interleaved comb-like electrodes of the at least one interdigital transducer which are perpendicular to the elastic surface wave propagating direction include a combination of at least one pair of partial edges, the positions of the partial edges in each of the at least one pair of partial edges differ by $(2n+1) \cdot \lambda/4$ from each other in the elastic surface wave proparating direction, and the lengths of the partial edges in the said each pair of the partial edges are equal to each other, where n represents zero or a positive integer and $\lambda$ represents the wavelength of the elastic surface wave.

Figure 2:
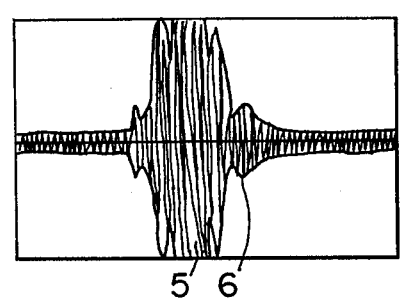
Figure 3:
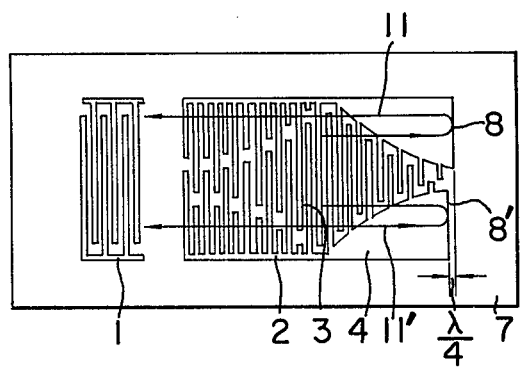
Figure 4:
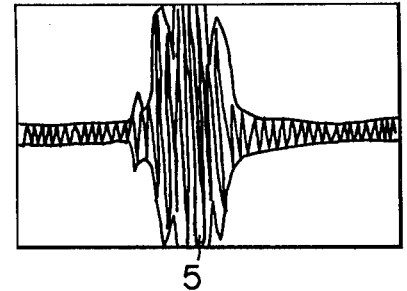
Figure 5:
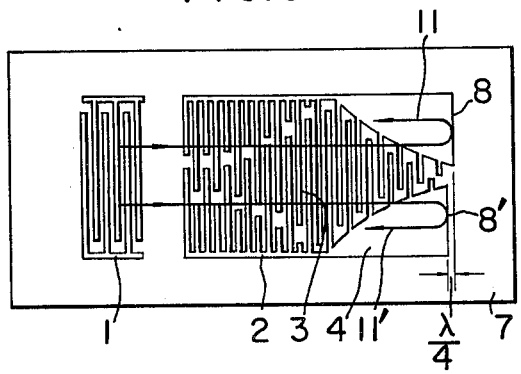
Figure 6:
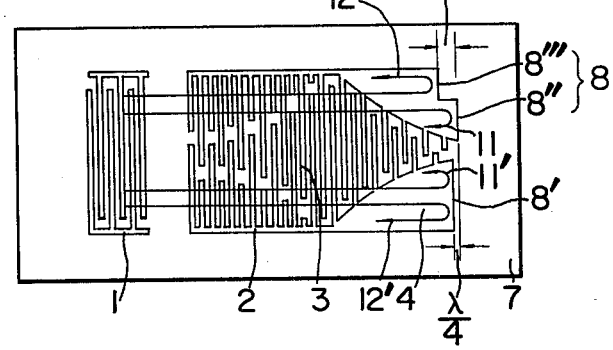
Figure 7:
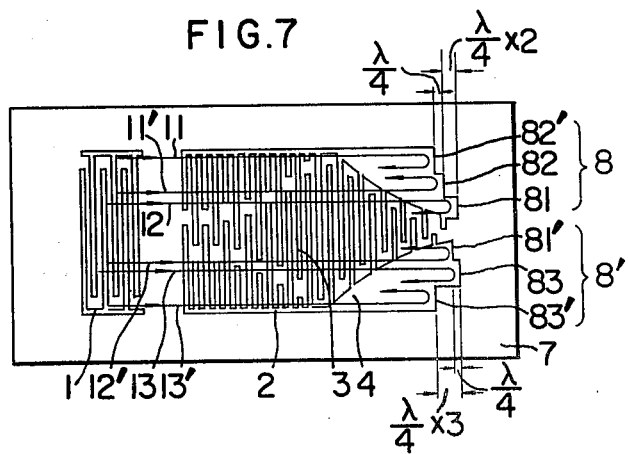

In the accompanying drawings:

FIG. 1 schematically shows in plan the principal portion of a conventional elastic surface wave filter;

FIG. 2 shows the waveform of a burst signal measured from the elastic surface wave filter shown in FIG. 1;

FIG. 3 schematically shows in plan the principal portion of an elastic surface wave filter as an embodiment of an elastic surface wave device according to this invention;

FIG. 4 shows the waveform of a burst signal measured from the elastic surface wave filter shown in FIG. 3;

FIG. 5 schematically shows in plan the principal portion of an elastic surface wave filter as another embodiment of an elastic surface wave device according to this invention;

FIG. 6 schematically shows in plan the principal portion of an elastic surface wave filter as another embodiment of an elastic surface wave device according to this invention; and FIG. 7 schematically shows in plan the principal portion of an elastic surface wave filter as another embodiment of an elastic surface wave device according to this invention.

For a better understanding of the present invention, description will first be made on a conventional elastic surface wave filter shown in FIG. 1 to explain the above-mentioned problems encountered with the prior art. A similar elastic surface wave filter is shown, for example, in Japanese Patent Application Laid-Open No. 54389/76 (Tokyo Shibaura Electric Co., Ltd.), laid open on May 13, 1976. In FIG. 1 schematically showing the principal portion of the filter, i.e., an overlap-weighted interdigital transducer and its associated portion, reference numeral 1 indicates an interdigital transducer with regular overlap lengths and 2 an interdigital transducer with weighted overlap lengths, which is characteristic of this elastic surface wave filter. The technique of weighting the overlapping lengths of the interleaved fingers 3 of the comb-like electrodes is necessary to obtain complex frequency and delay time characteristics. Reference numeral 4 designates these portions at the end of the comb-like electrodes which are formed by integrating the non-overlapping portions of the overlapped fingers of the comb-like electrodes into "unitary stem area" so as to facilitate the fabrication process. Numeral 7 designates a substrate of a piezoelectric material serving as a medium for the propagation of an elastic surface wave; 8 and 8' the extreme edges of the electrodes; 10 and 10' propagation paths for the elastic surface waves reflected from the end of the substrate; and 11 and 11' propagation paths for the elastic surface waves reflected from the extreme edges 8 and 8' of the comb-like electrodes.

In FIG. 1, the elastic surface wave filter uses the overlap-weighted interdigital transducer 2 as an input transducer and the regularly overlapped interdigital transducer 1 as an output transducer. With the elastic surface wave filter having such a structure as described above, if a main signal is supplied to the input transducer 2, the input transducer 2 generates an elastic surface wave (not shown) which is propagated directly toward the output transducer 1 and also the elastic surface waves 10 and 10' which are initially propagated in the direction opposite to the output transducer 1 and then reflected from the end of the substrate 7 to travel again toward the output transducer 1, and the elastic surface waves 11 and 11' which are initially propagated in the direction opposite to the transducer 1 and then reflected from the edges 8 and 8' of the integrated portions of the electrodes to travel again toward the output transducer 1. Especially, the surface waves 10 and 10' reflected from the end of the substrate 7 attracted the attentions of many researchers. Numerous techniques have been developed to attenuate the reflective waves. For example, according to one of those developed techniques, material mainly of a resin for absorbing ultrasonic waves is applied between the ends of the substrate 7 and the input and output transducers 2 and 1. This method can attenuate the elastic surface wave reflected from the end of the substrate 7 to a satisfactory extent.

However, in the research of the reflective surface waves from the end of the substrate 7, the Inventors of the present invention found that there exist disturbance signals inexplainable by the conventional knowledge and having a shorter delay time than the signals corresponding to the reflective surface waves from the end of the substrate 7. The disturbance signals which correspond to the reflective surface waves from the end of the substrate 7 and therefore can be eliminated, usually have a delay time of 3–5 μsec, though it varies depending on the distances between the ends of the substrate and the input and output transducers, but the inexplainable disturbance signals have a delay time of less than 2 μsec. If the distances are small, both the explainable and inexplainable disturbance signals approximate in delay time to each other, as easily seen by those skilled in the art.

FIG. 2 shows a burst signal response of the elastic surface wave filter shown in FIG. 1, in which reference numeral 5 indicates a desirable main signal and 6 the inexplainable disturbance signal found by the Inventors. In the examination of the elastic surface wave filter prepared for test by the Inventors, the disturbance signal 6 has a delay time of about 2 μsec and an amplitude of about −30 dB with respect to the main signal. It is therefore apparent that the disturbance signal will considerably degrade the filtering characteristic and that this will be a serious drawback.

Now, the technical principle of the present invention will first be described and then the embodiments of this invention will be described with the aid of the attached drawings, perticularly FIG. 3. The elastic surface wave device may include two or more interdigital transducers each including a pair of interleaved comb-like electrodes on a piezoelectric substrate, but at least one of the transducers has overlap-weighted pair of interleaved comb-like electrodes. In the simplest case, a pair of edges 8 and 8′ of the unitary stem areas of the comb-like electrodes of the overlap-weighted transducer perpendicular to the elastic surface wave propagating direction have the same length and the position of the edge 8 of one unitary stem area is different by (λ/4) from the position of the edge 8′ of the other unitary stem area in the elastic surface wave propagating direction, the difference of (λ/4) corresponding to the case where n=0. In this case, the difference between the paths along which the signals propagate in forward and backward directions in the comb-like electrode due to the reflection from the edges 8 and 8′ of the unitary stem areas, equals (λ/4)×2, i.e. half wavelength. Since the lengths of the edges 8 and 8′ are substantially equal to each other, the amplitudes of the signals reflected therefrom become equal. Also, since there is a phase difference of 180° between the signals, the resultant signal received at the output transducer is reduced to zero, that is, the disturbance signals vanish.

Now, some embodiments of this invention will be described with the aid of the attached drawings.

FIG. 3 schematically shows in plan the principal portion of an elastic surface wave filter as an embodiment of an elastic surface wave device according to this invention. In FIG. 3, the same reference numerals as used in FIG. 1 indicate equivalent elements or parts. In this embodiment, the substrate of the elastic surface wave filter is a plate 7 of lithium niobate LiNbO$_3$ having two principal surfaces of 3 mm×7 mm, through which sound propagates at a speed of about 3900 m/sec at room temperatures, and the theoretical center frequency of the main signal determined in the stage of design is 57 MHz so that λ≈69 μm.

Accordingly, the input overlap-weighted interdigital transducer 2 should have comb-like electrodes with lengths of the edges 8 and 8′ of their unitary stem areas set equal to each other and also with the position of the edge 8 set different by (λ/4)≈17 μm from the position of the edge 8′ in the elastic surface wave propagating direction.

An elastic surface wave filter having such a structure as described above was fabricated by the well-known method and the burst signal mentioned above was observed to estimate its characteristic. FIG. 4 shows the result of the measurement of the characteristic of the filter, depicting the waveform of the burst signal. As seen from FIG. 4, the disturbance signal 6, which appears in FIG. 2, is attenuated, that is, suppressed down to −40 dB with respect to the main signal 5. The attenuated signal is identified as the disturbance signal 6 since the delay time of the attenuated signal remains the same even though the dimension of the substrate 7 in the elastic surface wave propagating direction is increased to prolong the paths 10 and 10′ of the surface waves, as in FIG. 1, reflected from the end of the substrate 7.

The mechanism of the attenuation of the disturbance signal 6 will be considered as follows according to the technical basis of this invention.

The main portion of the elastic surface wave generated by the input overlap-weighted transducer 2 propagates toward the output transducer 1 with a regular overlap and received as a main signal 5 by the transducer 1. However, the remaining portion of the generated elastic surface wave propagates in the direction opposite to the output transducer 1. The reversely propagating waves are partially reflected from the edges 8 and 8′ of the unitary stem areas of the comb-like electrodes of the input transducer 2. The reflected signals, when received by the output transducer 1 after having traveled along the paths 11 and 11′, have the same amplitude and a phase difference of 180° from each other as described above, since the signal along the path 8 has traveled further by (λ/4)×2 than the signal along the path 8′. The received signals therefore cancel each other to produce zero output. Thus, the disturbance signal 6 is eliminated as shown in FIG. 4.

FIG. 5 schematically shows in plan another embodiment of an elastic surface wave device, in which a weighted-overlap interdigital transducer 2 as used in the first embodiment is used as an output transducer while an interdigital transducer 1 with a regular overlap as used in the first embodiment is used as an input transducer.

The output overlap-weighted interdigital transducer 2 has identical comb-like electrodes with identical unitary stem areas and therefore the lengths of the edges 8 and 8′ equal to each other and their positions in the elastic surface wave propagating direction differ by λ/4 from each other. The substrate 7 is plate of lithium niobate LiNbO$_3$ with its main surface area of 7 mm×3 mm. With this structure, the major part of the elastic surface wave generated by the input transducer 1 propagates along the paths 11 and 11′ and is taken out from the output transducer 2 as a main signal. The remaining part of the generated wave is reflected from the edges 8 and 8′ of the unitary stem areas of the comb-like electrodes of the output transducer 2 to become disturbance signals. The disturbance signals, which are the signals reflected from the edges 8 and 8′, have the same amplitude and a phase difference of 180° corresponding to the path difference of 2×(λ/4)=(λ/2) so that they cancel each other, as in the first embodiment.

As apparent from the comparison of the second embodiment with the first one, the locations of the overlap-weighted transducer and the transducer with regular overlap are interchanged in these embodiments.

Such alternative selections of the transducers of different types as input and output devices depend on the use of the filter. For example, the impedance of the transducer may be one of the factors to determine which structure should be employed, as in FIG. 3 or 5.

In the above embodiments, the difference between the positions of the edges 8 and 8' is chosen to be ($\lambda/4$), but the same effect can be obtained also in the case where the difference is $3 \times (\lambda/4)$, $5 \times (\lambda/4)$, $7 \times (\lambda/4)$, ..., or $(2n \times 1)$ ($\lambda/4$), where n is a positive integer. Namely, if the difference is made equal to $(2n \times 1) \times (\lambda/4)$, the difference between the paths along which the signals propagate forward and backward due to the reflection from the edges 8 and 8' equals twice the positional difference (back and forth) such that $$(2n+1) \times (\lambda/4) \times 2 = n\lambda + (\lambda/2).$$

In general, concerning a periodical function with a period of $\lambda$, the term $n\lambda$ makes no difference and the term ($\lambda/2$) plays a leading role. Thus, if the positional difference is equal to $(2n+1)$ ($\lambda/4$), the path difference always becomes ($\lambda/2$) so that the phase difference between the reflected signals equals 180° to produce zero output.

In the above embodiments, the edges 8 and 8' of the broad end portions of the comb-like electrodes are straight with the same length. It is, however, easily understood that the geometrical shapes of the edges may be somewhat changed without departing from the technical concept of this invention. Namely, the edges of the unitary stem areas of an interdigital transducer with overlap-weighted pair of interleaved comb-like electrodes include a combination of at least one pair of partial edges, the edges being perpendicular to the elastic surface wave propagating direction. In that case, two requirements must be satisfied. First, the lengths of the partial edges in each pair of partial edges must be equal to each other. Secondly, the positional difference between the two partial edges in the said each pair must equal to $(2n+1)$ ($\lambda/4$) (n=0, 1, 2, ...). So far as the two requirements are satisfied, a signal reflected from one partial edge and another signal reflected from another partial edge paired with the first-mentioned partial edge (i.e., having the same length as and the above-specified positional relation with first-mentioned partial edge) have the same amplitude and a phase difference of 180° so that they cancel each other to produce zero output.

FIG. 6 schematically shows in plan an elastic surface wave filter as a third embodiment of an elastic surface wave device according to this invention, which filter meets the two requirements described above. In this third embodiment, as shown in FIG. 6, one of the edges consists of partial edges 8" and 8'" each having a length equal to half the length of the other edge 8', the partial edge 8" corresponding to one half of the edge 8' (to form one partial edge pair) and the partial edge 8'" to the other half of the edge 8' (to form another partial edge pair). The positional difference between the partial edge 8" and the one half of the edge 8' is ($\lambda/4$)≈17 $\mu$m and that between the partial edge 8'" and the other half of the edge 8' is ($\lambda/4$)×3≈51 $\mu$m. Therefore, the signals reflected from each partial edge pair, i.e., from the partial edges and their equivalents as two halves of the edge 8' cancel each other to produce no disturbance signal at the output transducer.

Since the edge 8' is not physically divided into partial edges, the lengths of the partial edges 8" and 8'" need not necessarily be set equal to each other. If other restrictive conditions are to be taken into consideration, the lengths may be suitably controlled to meet the conditions. Also, in that case, the reflected signals produces no output as well.

FIG. 7 schematically shows in plan an elastic surface wave filter as a fourth embodiment of an elastic surface wave device according to this invention, in which both the edges 8 and 8' of the unitary stem areas of the comb-like electrodes of the overlap-weighted interdigital transducer are more complicatedly divided into partial edges to meet other restrictive conditions. In this embodiment, as shown in FIG. 7, the edges 8 and 8' includes three pairs of partial edges 81, 81'; 82, 82' and 83, 83'. The partial edges 81, 82 and 83 have lengths equal to those of the partial edges 81', 82' and 83', respectively. The positional differences of these paired partial edges are 17 $\mu$m, 17 $\mu$m and 51 $\mu$m, respectively in the order mentioned. Accordingly, the signals reflected from the partial edges 81 and 81' and propagating along the paths 12 and 12' have a phase difference of 180° corresponding to the path difference and therefore cancel each other. In like manner, the signals reflected from the paired partial edges 82 and 82' or 83 and 83', propagating along the paths 11 and 11' or 13 and 13', have a phase difference of 180° and therefore cancel each other.

Consequently, the disturbance signals caused by the reflected waves from the edges can generally be suppressed to a considerable extent.

As described above, according to this invention, the proposed elastic surface wave device can remarkably suppress the disturbance signal generated due to the reflection of surface waves at the edges of the unitary stem areas of the comb-like electrodes of the overlap-weighted interdigital transducer so that the filtering characteristic is considerably improved.

What we claim is:

1. An elastic surface wave device comprising a substrate of a piezoelectric material serving as a medium of the propagation of an elastic surface wave and a plurality of interdigital transducers each including a pair of interleaved comb-like electrodes provided on said substrate, each of said comb-like electrodes having a plurality of fingers to be interleaved, wherein at least one of said interdigital transducers has an overlap-weighted pair of interleaved comb-like electrodes, those portions of overlapped fingers at ends of said overlap-weighted pair of interleaved comb-like electrodes which do not contribute to the overlap weighting being formed into unitary stem areas, those edges of said unitary stem areas of said interleaved comb-like electrodes of said at least one interdigital transducer which are perpendicular to the elastic surface wave propagating direction including a combination of at least one pair of partial edges, the positions of said partial edges in each of said at least one pair of partial edges differing by $(2n+1)$. ($\lambda/4$) from each other in the elastic surface wave propagating direction, and the lengths of the partial edges in the said each pair of the partial edges being equal to each other, where n represents zero or a positive integer and $\lambda$ represents the wavelength of the elastic surface wave.

2. An elastic surface wave device as claimed in claim 1, wherein the interdigital transducer having said overlap-weighted interleaved comb-like electrodes serves as an input transducer.

3. An elastic surface wave device as claimed in claim 1, wherein the interdigital transducer having said overlap-weighted interleaved comb-like electrodes serves as an output transducer.

4. An elastic surface wave device as claimed in claim 2 or 3, wherein one pair of partial edges is provided.

5. An elastic surface wave device as claimed in claim 2 or 3, wherein n is equal to zero.

6. An elastic surface wave device as claimed in claim 4, wherein n is equal to zero.

* * * * *